(12) United States Patent
Niimi et al.

(10) Patent No.: US 8,803,253 B2
(45) Date of Patent: Aug. 12, 2014

(54) REPLACEMENT METAL GATE PROCESS FOR CMOS INTEGRATED CIRCUITS

(75) Inventors: Hiroaki Niimi, Dallas, TX (US); Seung-Chul Song, San Diego, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/609,621

(22) Filed: Sep. 11, 2012

(65) Prior Publication Data

US 2014/0070327 A1    Mar. 13, 2014

(51) Int. Cl.
*H01L 29/78*    (2006.01)
*H01L 27/092*   (2006.01)

(52) U.S. Cl.
CPC .......... *H01L 27/092* (2013.01); *H01L 27/0928* (2013.01)
USPC ............................ 257/410; 257/411; 257/412

(58) Field of Classification Search
CPC ............. H01L 27/092; H01L 27/0922; H01L 27/0928
USPC .......................................... 257/410, 411, 412
See application file for complete search history.

(56) References Cited

U.S. PATENT DOCUMENTS

| | | | |
|---|---|---|---|
| 7,148,548 B2 | 12/2006 | Doczy et al. | |
| 8,062,966 B2 | 11/2011 | Mehrad et al. | |
| 2012/0228715 A1* | 9/2012 | Niimi et al. | 257/369 |
| 2012/0261761 A1* | 10/2012 | Wang et al. | 257/368 |
| 2012/0329262 A1* | 12/2012 | Na et al. | 438/595 |
| 2013/0154019 A1* | 6/2013 | Ando et al. | 257/369 |
| 2013/0214358 A1* | 8/2013 | Jagannathan et al. | 257/347 |
| 2013/0217219 A1* | 8/2013 | Ando et al. | 438/591 |
| 2013/0217220 A1* | 8/2013 | Jagannathan et al. | 438/592 |
| 2013/0260549 A1* | 10/2013 | Jagannathan et al. | 438/592 |
| 2013/0264652 A1* | 10/2013 | Zhu et al. | 257/369 |
| 2013/0270619 A1* | 10/2013 | Schloesser et al. | 257/295 |
| 2013/0273729 A1* | 10/2013 | Hempel et al. | 438/592 |
| 2013/0292744 A1* | 11/2013 | Kim et al. | 257/288 |
| 2013/0302974 A1* | 11/2013 | Hahn et al. | 438/585 |

OTHER PUBLICATIONS

Chatterjee et al., "CMOS Metal Replacement Gate Transistors using Tantalum Pentoxide Gate Insulator", Digest of Technical Papers, 1998 International Electron Device Meeting (IEEE, 1998), pp. 777-780.

* cited by examiner

*Primary Examiner* — Ngan Ngo
(74) *Attorney, Agent, or Firm* — Jacqueline J. Garner; Frederick J. Telecky, Jr.

(57) ABSTRACT

A complementary metal-oxide-semiconductor (CMOS) integrated circuit structure, and method of fabricating the same according to a replacement metal gate process. P-channel and n-channel MOS transistors are formed with high-k gate dielectric material that differ from one another in composition or thickness, and with interface dielectric material that differ from one another in composition or thickness. The described replacement gate process enables construction so that neither of the p-channel or n-channel transistor gate structures includes the metal gate material from the other transistor, thus facilitating reliable filling of the gate structures with fill metal.

8 Claims, 11 Drawing Sheets

REPLACEMENT METAL GATE PROCESS FOR CMOS INTEGRATED CIRCUITS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuit manufacture. Embodiments of this invention are more specifically directed to complementary metal-oxide-semiconductor (CMOS) integrated circuits having metal-gate transistors with high dielectric constant gate dielectrics.

Many modern electronic devices and systems now include substantial computational capability for controlling and managing a wide range of functions and useful applications. As is fundamental in the art, reduction in the size of physical feature sizes of structures realizing transistors and other solid-state devices enables greater integration of more circuit functions per unit "chip" area, or conversely, smaller chip area consumed for a given circuit function. The capability of integrated circuits for a given cost has greatly increased as a result of this miniaturization trend.

Advances in semiconductor technology in recent years have enabled the shrinking of device minimum device feature size (e.g., the width of the gate electrode of a metal-oxide-semiconductor (MOS) transistor, which defines the transistor channel length) into the extreme sub-micron range. State of the art transistor channel lengths are now approaching the sub-20 nanometer regime. For MOS transistors, the scaling of transistor feature sizes into the deep submicron realm necessitates the thinning of the MOS gate dielectric layer. Conventional gate dielectric layers (e.g., silicon dioxide) have thus become extremely thin, which can be problematic from the standpoint of gate current leakage, manufacturing yield and reliability. In response to this limitation of conventional gate dielectric material, so-called "high-k" gate dielectrics, such as hafnium oxide ($HfO_2$), have become popular. These dielectrics have higher dielectric constants than silicon dioxide and silicon nitride, permitting those films to be physically thicker than corresponding silicon dioxide films while remaining suitable for use in high performance MOS transistors. Because these high-k films are currently of lesser quality (from a defect density standpoint) than conventional dielectric material, typical conventional high-k gate dielectrics include both the high-k material and a high quality interface layer of silicon dioxide or the like; the silicon dioxide provides good dielectric integrity and quality, while the high-k material has a sufficiently high dielectric constant to make up for any degradation in electrical performance due to the interface layer.

As also known in the art, gate electrodes of metals and metal compounds, such as titanium nitride, tantalum-silicon-nitride, tantalum carbide, and the like are now also popular in modern MOS technology, especially in combination with high-k gate dielectrics. These metal gate electrodes eliminate the undesired polysilicon depletion effect, which is particularly noticeable at the extremely small feature sizes required of these technologies.

As fundamental in the art, attainment of the desired MOS transistor performance, specifically its threshold voltage, requires tuning of the characteristics of the gate material along with the dopant concentration and other physical parameters of the silicon channel region and source/drain regions. An important parameter in this tuning is the work function of the gate electrode. CMOS integrated circuits complicate this engineering, because the desired gate material work function is necessarily different for n-channel MOS transistors than for p-channel MOS transistors. For polysilicon gate material, this different work function is relatively easy to attain by way of ion implant, for example by exposing each gate electrode to the source/drain implants for its transistor; fine tuning is accomplished by threshold adjust implant to the channel region prior to gate formation.

While post-formation doping of metal gate electrodes has been used to adjust the metal gate work function, conventional high-k metal gate CMOS manufacturing processes often use different gate materials for n-channel and p-channel transistors. The provision of these different gate materials has resulted in structural issues in conventional CMOS integrated circuits, as will now be described in connection with FIGS. 1a through 1h.

Figure 1A:
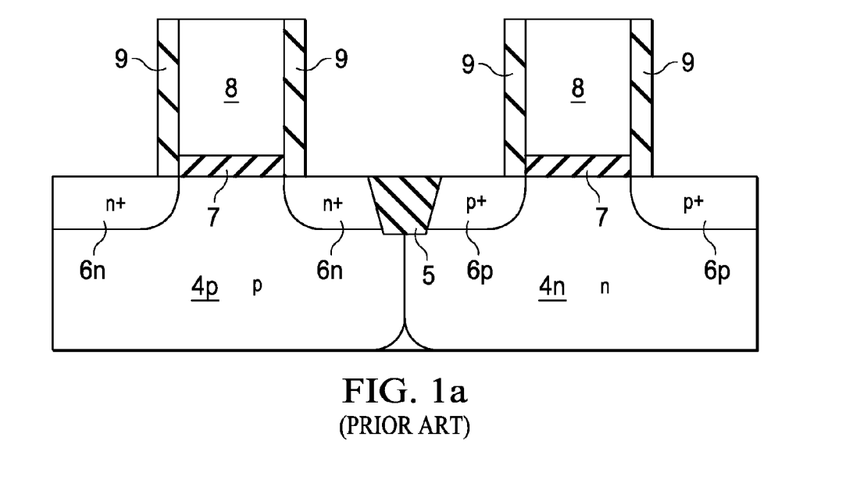
FIGS. 1a through 1h are cross-sectional views of an integrated circuit at various stages of manufacture according to a conventional manufacturing process flow.

FIG. 1a illustrates, in cross-section, a portion of a high-k metal gate CMOS integrated circuit, partially fabricated according to a conventional process. The structure of FIG. 1a includes many features common to conventional polysilicon-gate CMOS integrated circuits, including p-well 4p and n-well 4n formed at the surface of a single-crystal silicon substrate. Isolation dielectric structure 5, for example in the form of a shallow trench isolation (STI) structure, is formed at the surface of the substrate, at the boundary between wells 4p, 4n; other instances of isolation dielectric structure 5 will be present in the integrated circuit to isolate separate transistors from one another, including within wells 4p, 4n, as known in the art. In the example of FIG. 1a, polysilicon gate structures 8 are disposed over selected locations of wells 4p, 4n, namely at the locations at which the eventual transistor gates will be formed, and overlying gate dielectric layer 7. N+ source/drain regions 6n are heavily-doped regions formed into p-well 4p on opposing sides of gate structures 8, and p+ source/drain regions 6p are similarly heavily-doped regions formed into n-well 4n on opposing sides of gate structures 8. Source/drain regions 6n, 6p are formed by conventional ion implantation in a self-aligned manner relative to gate structures 8, and to sidewall dielectric spacers 9 in place along the sides of gate structures 8. In this conventional process, spacers 9 are formed on opposing sides of gate structures 8 to define the eventual gate width of the metal-gate transistor. These spacers 9 themselves, or in combination with additional sidewall spacers, may be used to define lightly-doped-drain source/drain extensions, as known in the art.

Figure 1B:
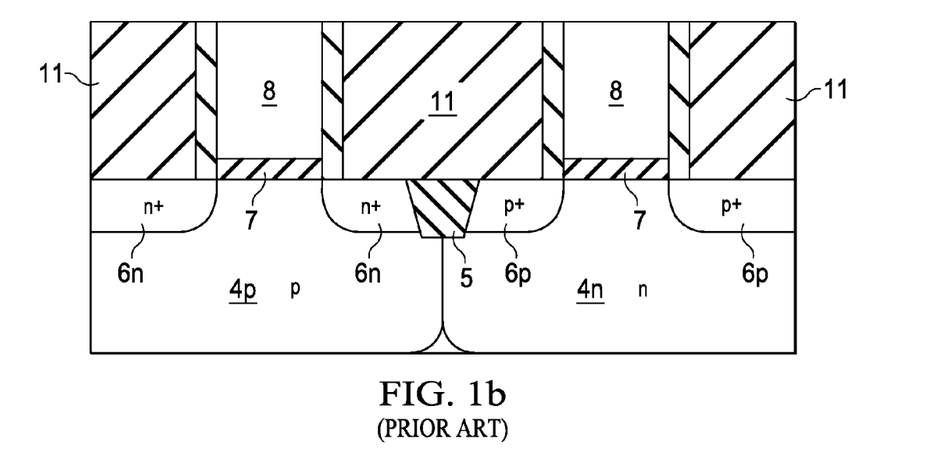
Figure 1C:
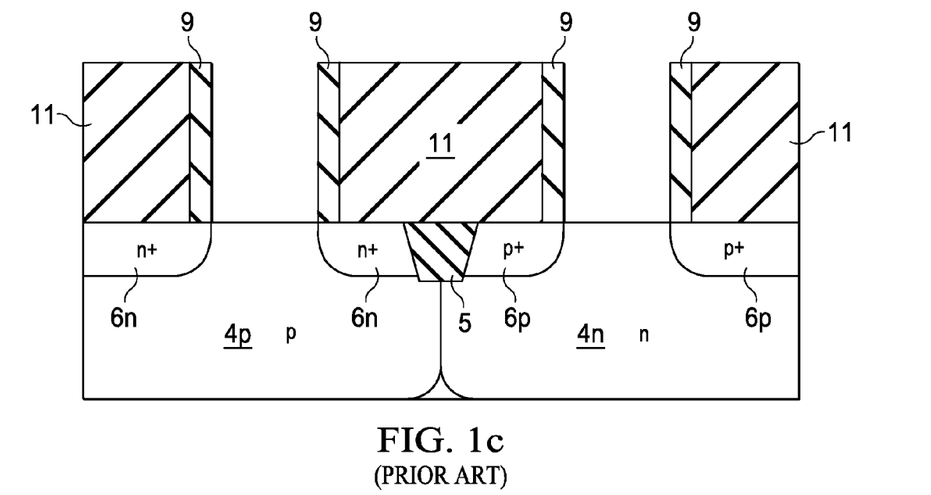

In this conventional high-k metal gate technology, gate structure 8 and gate dielectric 7 are "dummy" structures, in that these elements do not become part of the finished integrated circuit. Rather, dummy gate structure 8 and dummy gate dielectric 7 serve as placeholders for defining the placement of source/drain regions 6n, 6p, and will be removed. In FIG. 1b, gap fill dielectric material 11 has been formed by chemical vapor deposition (CVD) overall, followed by chemical-mechanical polishing (CMP) to planarize the structure. Gap fill dielectric 11 fills in the spaces between dummy gate structures 8, and will generally remain throughout the formation of the high-k metal gate transistors. Subsequent etches remove dummy gate structures 8 and dummy gate dielectric 7, resulting in the structure of FIG. 1c.

Figure 1D:
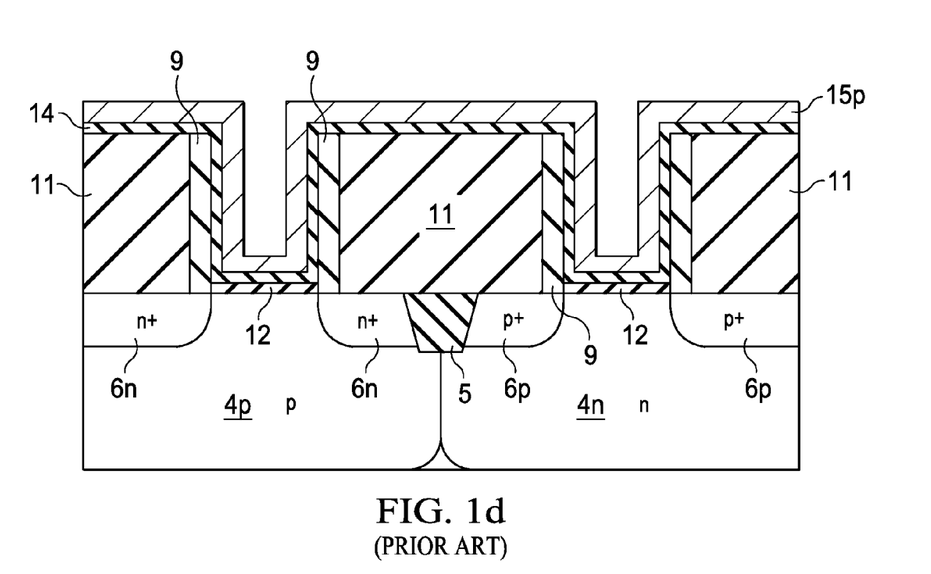

Referring to FIG. 1d, following the removal of dummy gate structures 8 and dummy gate dielectric 7, this conventional process deposits high-k dielectric 14 (typically overlying a thin interface layer, not shown in FIG. 1d). High-k dielectric 14 is formed by chemical vapor deposition (CVD) or atomic layer deposition (ALD) of a material with a relatively high dielectric constant as compared with silicon dioxide or silicon nitride; a typical conventional high-k dielectric material is $HfO_2$, with other choices for high-k dielectric 14 also known in the art. Metal gate layer 15p is a layer of a metal or conductive metal compound that by its composition or by doping has a work function suitable for serving as the gate for p-channel MOS transistors with the desired threshold voltage for purposes of this integrated circuit. Examples of metal gate layer 15p include one or more of palladium, nickel, iridium, ruthenium, tungsten, molybdenum, tungsten nitride, carbonitrides including titanium carbonitride and tantalum carbonitride, oxynitrides, ruthenium oxide, TiAlN, TaCNO, and the like. Typically, a barrier metal layer (not shown) underlies the eventual metal gate layer 15p, to prevent interdiffusion among the materials. In this conventional process, metal gate layer 15p is then deposited overall, including over both n-well 4n at which a p-channel transistor will be formed and over p-well 4p at which an n-channel transistor will be formed.

Figure 1E:
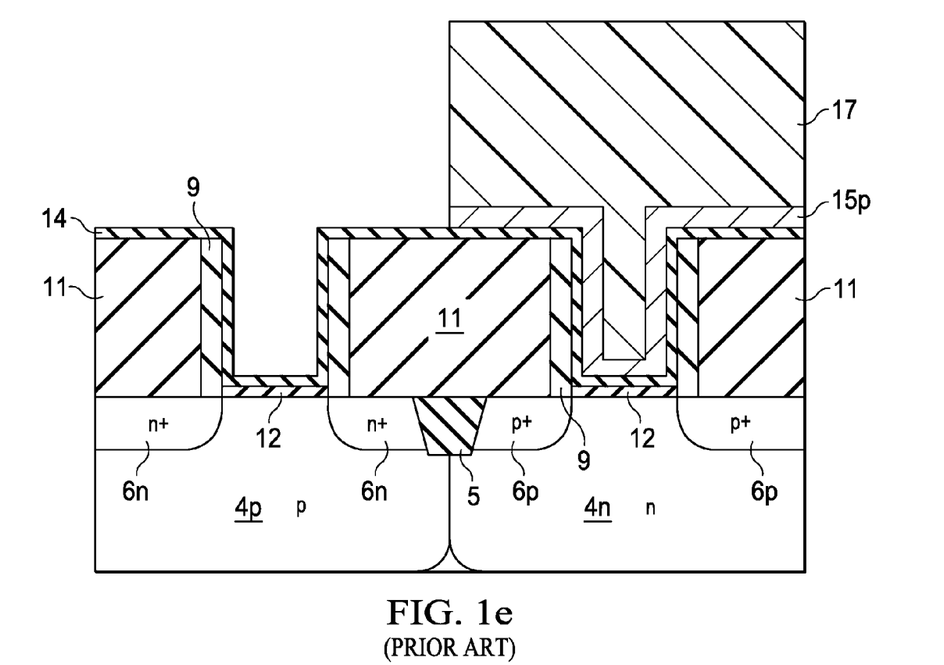
Figure 1F:
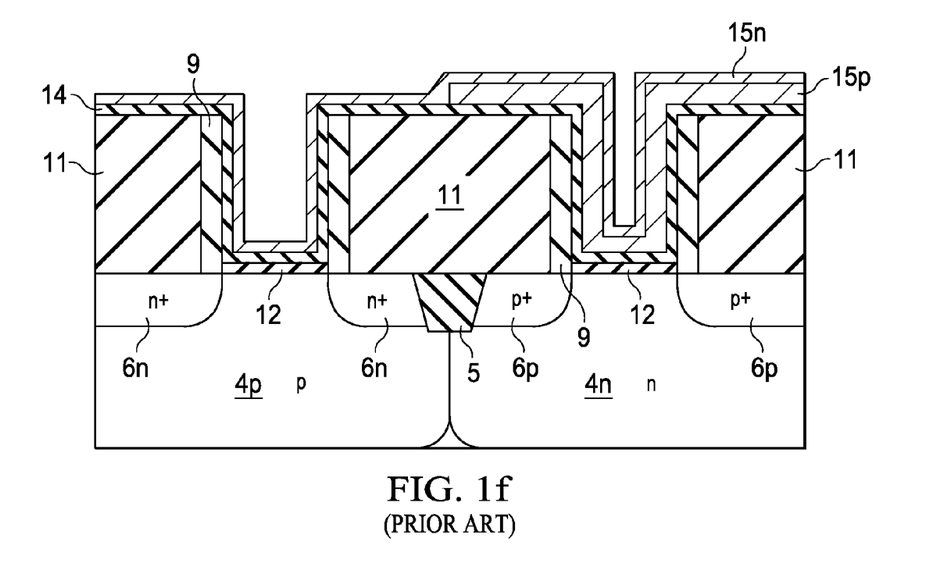
Figure 1G:
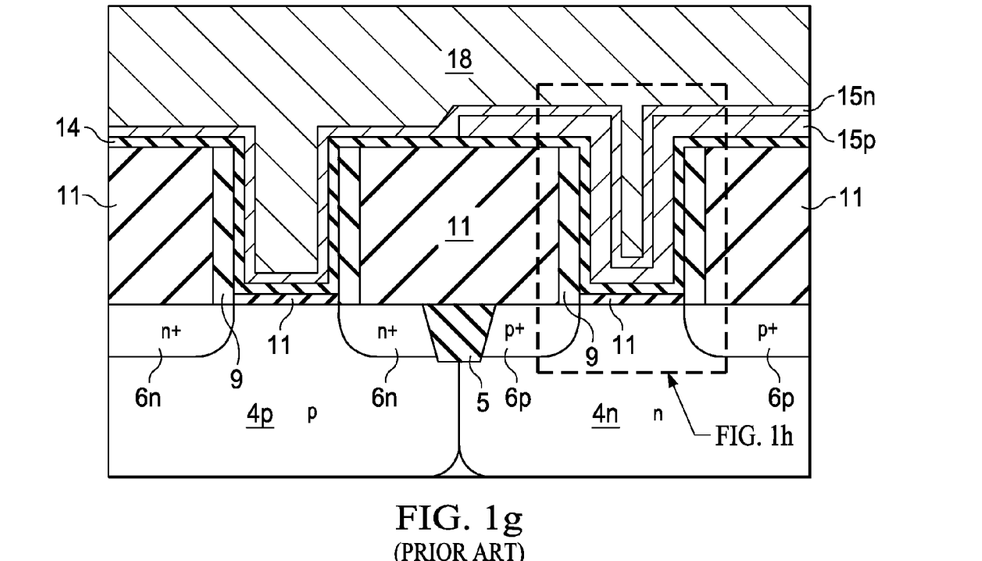

Formation of the n-channel transistor is then performed, in this conventional process, by the dispensing and photolithographic patterning of photoresist 17, as shown in FIG. 1e, to protect the locations of the integrated circuit at which p-channel transistors are to be formed (i.e., n-well 4n) and expose those locations at which n-channel transistors are to be formed. An etch of metal gate layer 15p from those exposed locations results in the structure of FIG. 1e, with high-k gate layer 14 and any underlying interface layer remaining in place. Photoresist 17 remaining over n-well 4n is then removed.

Metal gate layer 15n, composed of a metal or conductive metal compound that by its composition or by doping has a work function suitable for serving as the gate for n-channel MOS transistors with the desired threshold voltage, is then deposited over both p-well 4p at which an n-channel transistor will be formed, and also over metal gate layer 14p remaining in place over n-well 4n. The material of metal gate layer 15n may consist of one or more elemental metals, ternary metals, metal alloys, and conductive metal compounds. Examples of metal gate layer 15n include tantalum, titanium, hafnium, and their nitride and carbide compounds; silicon nitride, aluminum nitride, and aluminum silicon nitride compounds; and combinations thereof. Typically, a barrier metal layer (not shown) underlies the eventual metal gate layer 15n, to prevent interdiffusion among the materials.

Following deposition of metal gate layer 15n, another barrier layer (not shown) is typically formed, followed by deposition of fill metal 18 overall. Fill metal 18 is intended to fill the remaining interior gap within the eventual gate electrodes of the two transistors. Examples of the conventional composition of fill metal 18 include tungsten, aluminum, and the like. The resulting structure is shown in an idealized representation in FIG. 1g. This structure is then subjected to CMP to remove the excess metal, such CMP typically continuing until the surface of gap fill dielectric material 11 is cleared.

Figure 1H:
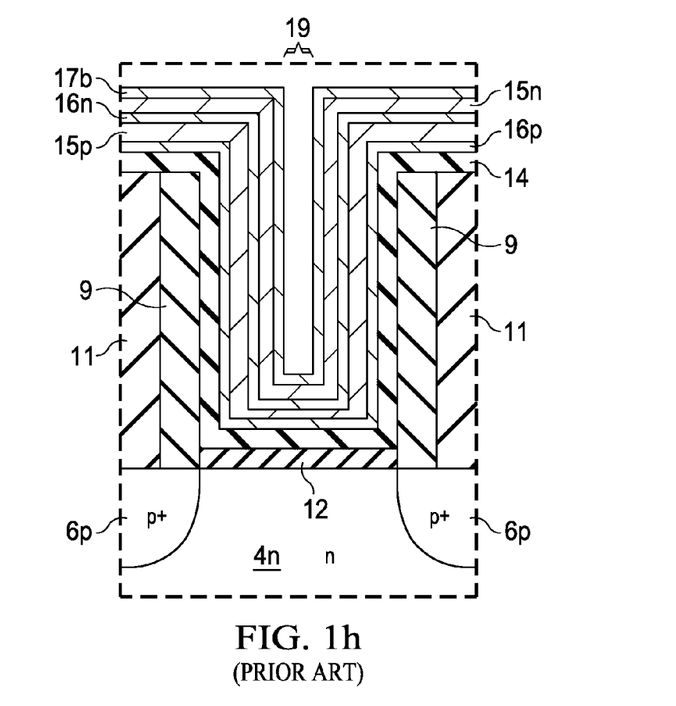

It has been observed, according to this invention, that this conventional process necessarily involves the filling of a very narrow gap within the p-channel transistor gate structure, with fill metal 18. FIG. 1h, which is an inset of FIG. 1g prior to the deposition of fill metal 18, illustrates this difficulty in additional detail. FIG. 1h shows the large number of layers that fill the space remaining after removal of dummy gate electrode 8 and dummy gate dielectric 7, according to a conventional process. Interface layer 12 is disposed at the bottom of the gate opening, on which high-k gate dielectric 14 is then formed. Barrier metal 16p is in contact with high-k gate dielectric 14, upon which metal gate layer 15p (for this p-channel MOS transistor) is then formed. Second barrier metal 16n is deposited over metal gate layer 15p, followed by metal gate layer 15n. Third barrier metal 17b is then formed over metal gate layer 15n, prior to the deposition of fill metal 18. As a result of this construction, gap 19 within the p-channel gate structure can be quite narrow, and thus difficult to fill with fill metal 18. This gap 19 has been observed to be sufficiently narrow as to cause problems in step coverage of fill metal 18 (i.e., thinning or opens at the corners of barrier metal layer 17b), as well as voids within the gate structure itself. Such voids can result in increased resistivity in conduction along the gate electrode, and thus non-uniform potential along the gate electrode for individual transistors, and inconsistencies in operation among a population of transistors.

In addition, the formation of metal gate layers 15n, 15p adjacent to one another in the same gate structure raises the risk of interdiffusion of material between the two metals, particularly from the overlying metal gate layer 15n into the underlying metal gate layer 15p. Such interdiffusion can change the work function of the intended gate metal (metal gate layer 15p in the example of FIG. 1h), and thus degrade the intended transistor performance. Accordingly, barrier metal layer 16n is necessary between these two metal gate layers, which inserts another layer of metal into the narrowing gap as well as complicating the overall manufacturing process.

By way of further background, commonly owned U.S. Pat. No. 8,062,966, issued Nov. 22, 2011, entitled "Method for Integration of Replacement Gate in CMOS Flow", and incorporated herein by this reference, describes a high-k metal gate structure and process, according to which CMOS integrated circuits are constructed using a replacement gate process.

BRIEF SUMMARY OF THE INVENTION

Embodiments of this invention provide a high-k metal gate complementary metal-oxide-semiconductor (CMOS) structure and a method of manufacturing the same in which replacement metal gate structures are formed for both transistors with good step coverage and good fill characteristics.

Embodiments of this invention provide such a structure and method in which the risk of interdiffusion between metal gate layers of differing work function is avoided.

Embodiments of this invention provide such a structure and method in which the high-k gate dielectric material can be optimized for both the p-channel MOS transistors and the n-channel MOS transistors in the same CMOS integrated circuit.

Other objects and advantages of embodiments of this invention will be apparent to those of ordinary skill in the art having reference to the following specification together with its drawings.

Embodiments of this invention may be implemented into a replacement gate manufacturing process flow for a high-k metal gate CMOS integrated circuit, and the structure formed by such a process, in which the dummy polysilicon gate and dummy gate dielectric structures are removed separately for the n-channel and p-channel MOS transistors relative to one another. The thickness and composition of the high-k gate dielectric material for the n-channel and p-channel MOS transistors, including any required interface layer between the underlying silicon and the high-k material, can be independently controlled in order to optimize the reliability and performance separately for the transistors of each conductivity type.

BRIEF DESCRIPTION OF THE SEVERAL VIEWS OF THE DRAWING

FIG. 2a is a plan view.

DETAILED DESCRIPTION OF THE INVENTION

This invention will be described in connection with its embodiments, namely as implemented into a complementary metal-oxide-semiconductor (CMOS) integrated circuit, as it is contemplated that the invention will be especially beneficial in such an application. However, it is further contemplated that this invention can be beneficially applied to other integrated circuit structures and processes. Accordingly, it is to be understood that the following description is provided by way of example only, and is not intended to limit the true scope of this invention as claimed.

Figure 2A:
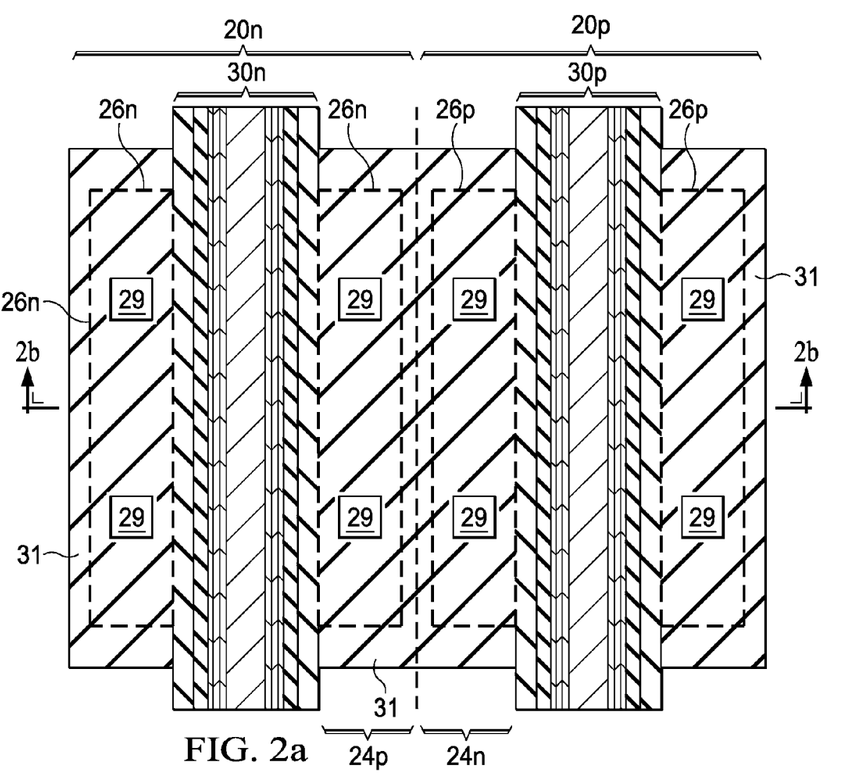
Figure 2B:
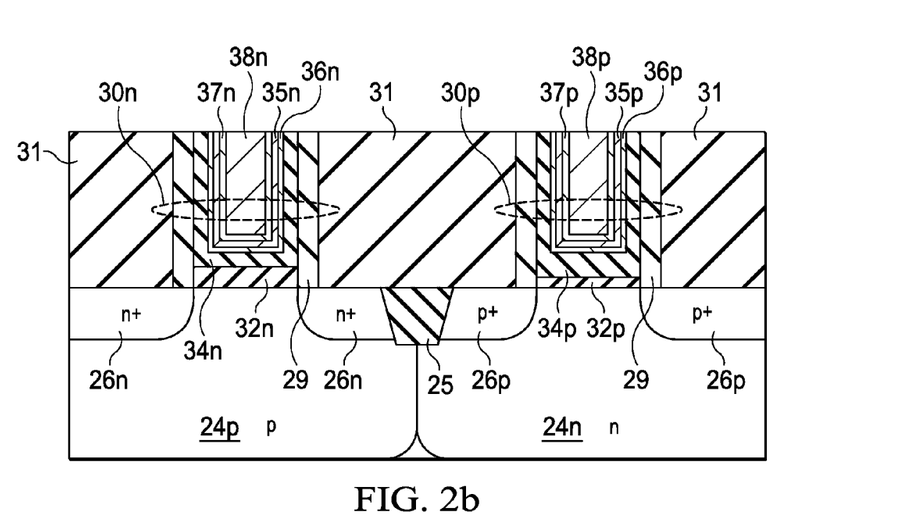
FIG. 2b is a cross-sectional view, of a complementary metal-oxide-semiconductor (CMOS) integrated circuit structure constructed according to embodiments of the invention.

FIGS. 2a and 2b illustrate, in plan and cross-sectional views, respectively, the construction of p-channel MOS transistor 20p and n-channel MOS transistor 20n, both constructed in a CMOS integrated circuit according to embodiments of this invention. While these Figures show transistors 20n, 20p located adjacent to one another, it is of course contemplated that these transistors 20n, 20p may be located at a larger distance from one another, and need not necessarily have an electrical relationship with one another. In addition, as fundamental in the art, many n-channel and p-channel transistors constructed similarly as transistors 20n, 20p described herein will typically be constructed within the same integrated circuit, varying in size (channel width, channel length, etc.) and shape of those transistors according to the layout and desired electrical characteristics.

In this example, transistor 20n is constructed within an instance of p-type well 24p and transistors 20p is constructed within an instance of n-type well 24n. According to a twin-well process, wells 24p, 24n are each well regions formed by way of ion implant into a single-crystal silicon substrate. Wells 24n, 24p, and also individual transistors within the same well, are generally isolated and separated from one another at the surface by an instance of isolation dielectric structure 25 (FIG. 2b). In this example, isolation dielectric structure 25 is constructed as a shallow trench isolation (STI) structure, consisting of a deposited dielectric material (e.g., silicon nitride or silicon dioxide) disposed into a trench etched into selected locations of the surface. Alternatively, isolation dielectric structure 25 may be formed of thermal silicon dioxide of a type constructed according to the well-known local-oxidation-of-silicon (LOCOS) process.

Alternatively, in the case of the CMOS integrated circuit being fabricated according to a single-well process, only one of wells 24p, 24n will be formed. For the example in which the substrate is p-type silicon, transistor 20n would be constructed into a surface portion of the substrate itself rather than into an instance of a separately formed p-type well. Further in the alternative, transistors 20n, 20p may be constructed within a surface silicon layer overlying an insulator layer, according to the well-known silicon-on-insulator (SOI) technology. In that case, wells 24n, 24p would be formed of doped regions of that silicon layer, with the doping typically extending throughout the thickness of that layer.

As shown in FIGS. 2a and 2b, transistors 20n, 20p each include respective metal gate structures 30n, 30p overlying selected portions of wells 24p, 24n, respectively. The construction of metal gate structures 30n, 30p will be described in further detail below. In n-channel transistor 20n, heavily-doped n-type source/drain regions 26n are disposed into the surface of p-well 24p on opposing sides of metal gate structure 30n, and constitute the source and drain regions of transistor 20n. Similarly, p-channel transistor 20p includes heavily-doped p-type source/drain regions 26p disposed on either side of metal gate structure 30p, at the surface of n-well 24n.

As will be described in detail below, metal gate structures 30n, 30p are formed according to a "replacement gate" process. As such, gap fill dielectric material 31 is disposed over the surface of source/drain regions 26n, 26p and isolation dielectric structure 25, at a thickness corresponding to the thickness of metal gate structures 30n, 30p (FIG. 2b). As evident from the plan view of FIG. 2a, contact openings 29 are formed through gap fill dielectric material 31 at selected locations of source/drain regions 26n, 26p, to allow subsequently deposited and patterned conductors to make electrical contact to transistors 20n, 20p.

Referring specifically to FIG. 2b, metal gate structure 30n is a laminated structure of several different physical layers. Metal gate structure 30n includes (or overlies, as the case may be) interface dielectric layer 32n, which is in contact with the surface of p-well 24p, at the bottom of metal gate structure 30n and between dielectric spacers 29. Interface layer 32n may be constructed of a thermal silicon dioxide, in which case its location is constrained to the surface of p-well 24p. Alternatively, interface layer 32n may be a deposited dielectric film (e.g., deposited silicon nitride, deposited silicon dioxide, or combination thereof), in which case interface layer 32n would generally be present along the sides of spacers 29.

Deposited high-k gate dielectric 34n overlies interface layer 32n, and in this embodiment of the invention is also present on the sides of spacers 29. High-k gate dielectric 34n is constructed of a dielectric material with a relatively high dielectric constant as compared with silicon dioxide or silicon nitride; typical high-k dielectric materials suitable for use as high-k gate dielectric 34n include hafnium oxide ($HfO_2$), hafnium zirconium oxide ($HfZrO_x$), and combinations of high-k materials, such as hafnium oxide in combination with zirconium oxide (e.g., $HfO_2/ZrO_2$ and $ZrO_2/HfO_2$). Other high-k dielectric materials known in the art may alternatively be used in embodiments of this invention.

The use of interface layer 32n in combination with high-k gate dielectric 34n in the construction of high-k metal gate transistors is well known in the art. Using current-day technology, high-k gate dielectric materials typically have a relatively high defect density as compared with high quality silicon dioxide and silicon nitride films. Accordingly, the use of only a high-k material as the gate dielectric of a MOS transistor would result in undesired gate leakage, and degraded transistor reliability. As known in the art, the effects of these defects in high-k gate dielectric materials can be minimized by constructing the transistor gate dielectric as a combination of the high-k dielectric material and a high quality interface layer of silicon dioxide or silicon nitride. The dielectric constant of the high-k material is contemplated to be sufficiently high that the additional series capacitance presented by the interface layer will not unduly reduce the effective capacitance of the combination to such an extent that the desired transistor and circuit performance goals cannot be met.

Overlying high-k gate dielectric 24n within metal gate structure 30n is a relatively thin layer of barrier metal 36n, above which metal gate layer 35n is disposed. Barrier metal 36n is provided to limit interdiffusion between metal gate layer 35n and high-k gate dielectric 24n, as known in the art. The composition of barrier metal 36n depends on the particular materials of the layers on either side, but is typically a metal from the lanthanide series (e.g., lanthanum, cerium, praseodymium, neodymium, promethium, samarium, europium, gadolinium, ytterbium), or a conductive metal compound thereof (e.g., lanthanum oxide). Metal gate layer 35n consists of an elemental metal, ternary metal, metal alloy, or conductive metal compound that is selected or doped to have a work function suitable for the desired electrical parameters (i.e., threshold voltage) of n-channel transistor 20n. Examples of suitable materials for metal gate layer 35n include tantalum, titanium, hafnium, zirconium, tungsten, molybdenum, and their nitride and carbide compounds; silicon nitride, aluminum nitride, and aluminum silicon nitride compounds; and combinations thereof.

Barrier metal 37n overlies metal gate layer 35n, and is provided to limit interdiffusion between metal gate layer 35n and overlying fill metal 38n. Examples of the material of barrier metal 37n include titanium nitride and tantalum nitride; other materials known in the art may alternatively be used as barrier metal 37n according to embodiments of this invention. Fill metal 38n completes metal gate structure 30n according to this embodiment of the invention, and is provided as a conductor that fills the interior of the gap between adjacent instances of gap fill dielectric 31. Examples of materials suitable for fill metal 38n include tungsten, aluminum, alloys thereof, and other conventional metals and materials that serve as conductors in modern integrated circuits.

Metal gate structure 30p is somewhat similarly constructed as metal gate structure 30n, with some differences in composition as will be described below. As in the case of metal gate structure 30n, metal gate structure includes or overlies interface dielectric layer 32p at the surface of n-well 34n, between dielectric spacers 29. Interface layer 32p may be constructed of the same material as interface layer 32n, or may alternatively be constructed from a different material; if of a different material, it is contemplated that the material of interface layer 32p will be selected from one of the materials listed above for interface layer 32n. Further in the alternative, interface layer 32p may be present along the sides of spacers 29, if it is a deposited film rather than a thermal film. High-k gate dielectric 34p overlies interface layer 32p, and extends along the sides of spacers 29 (and interface layer 32p, if present). High-k gate dielectric 34p may be constructed of the same material as high-k gate dielectric 34n, or may be composed of a different material if desired; if of a different material, it is contemplated that the material of high-k gate dielectric 34p will be selected from one of the materials listed above for high-k gate dielectric 34n.

According to embodiments of this invention, the thicknesses and composition of interface layer 32p and high-k gate dielectric 34p may differ from their counterpart films of interface layer 32n and high-k gate dielectric 34n. For example, it may be preferable for one of n-channel transistor 20n and p-channel transistor 20p to have a thinner effective gate dielectric than the other, in order to match or otherwise optimize device performance. Alternatively or in addition, differences in the particular materials used within metal gate structures 30n, 30p may motivate the selection of different thicknesses or materials for the respective gate dielectrics of transistors 20n, 20p. For the example illustrated in FIG. 2b, in one embodiment of the invention, interface layer 32n of transistor 20n is significantly thicker than interface layer 32p of transistor 20p, while high-k dielectric 34n of transistor 20n is significantly thinner than interface layer 34p of transistor 20p. In one example corresponding to the cross-section of FIG. 2b, in which transistors 20p, 20n have a nominal channel length of 15 to 40 nm and effective gate dielectric thicknesses (i.e., silicon dioxide equivalent) of between 1 and 2 nm, the composition and thicknesses of these materials are:

|  | Composition | Thickness |
| --- | --- | --- |
| Interface layer 32n | $SiO_2$ or SiON | 10 to 20 Å |
| High-k gate dielectric 34n | $HfZrO_x$, $HfO_2/ZrO_2$, or $ZrO_2/HfO_2$ | 10 to 30 Å |
| Interface layer 32p | $SiO_2$ or SiON | 5 to 15 Å |
| High-k gate dielectric 34p | $HfO_2$ | 15 to 35 Å |

In this example, the thinner high-k dielectric 34n (e.g., of $HfZrO_x$) is contemplated to reduce positive bias temperature instability (PBTI) of transistor 20n over time, while the thicker $HfO_2$ high-k gate dielectric 34p is contemplated to reduce negative bias temperature instability (NBTI) of p-channel transistor 20p over time. It is contemplated that, in many implementations, interface layer 32n of n-channel transistor 20n will be thicker than interface layer 32p of p-channel transistor 20p while high-k dielectric layer 34n of n-channel transistor 20n will be thinner than high-k dielectric layer 34p of p-channel transistor 20p. That tendency is reflected in the table above. Other combinations of composition and thickness for these films are also contemplated.

Similarly as in metal gate structure 30n, a relatively thin layer of barrier metal 36p overlies high-k dielectric layer 34n, and metal gate layer 35p is disposed over that barrier metal 36p. The composition and thickness of barrier metal 36p may be the same as barrier metal 36n, but may differ depending on the requirements caused by differences in the composition and thickness between metal gate layers 35n and 35p. Examples of materials suitable for use as metal gate layer 35 according to embodiments of this invention include one or more of palladium, nickel, iridium, ruthenium, tungsten, molybdenum, tungsten nitride, carbonitrides including titanium carbonitride and tantalum carbonitride, oxynitrides, ruthenium oxide, TiAlN, TaCNO, and the like. As discussed above, the material or doping, or both, of metal gate layers 35n, 35p will be separately selected for p-channel and n-channel MOS transistors 20p, 20n so as to have the desired work function, based on the desired threshold voltages for those devices. These differences in composition of metal gate layers 35n, 35p from one another may necessitate differences in the composition and thickness of associated barrier metal layers 36n, 36p to optimize their barrier properties for the particular mobile ions presented by respective metal gate layers 35n, 35p. The thicknesses of metal gate layers 35n, 35p (and barrier metal layers 36n, 36p) may differ from one another as well, depending on deposition and other manufacturing factors.

As in the case of metal gate structure 30n, barrier metal 37p overlies metal gate layer 35p, and is provided to limit interdiffusion between metal gate layer 35p and overlying fill metal 38p. The composition and thickness of barrier metal 37p may be the same as, or may differ from, barrier metal 37n, as appropriate for the particular composition of metal gate layer 35p. Fill metal 38p, which is typically of the same composition as fill metal 38n, completes metal gate structure 30p and serves as a conductor in the resulting integrated circuit.

According to embodiments of this invention, as particularly evident from FIG. 2b, the CMOS integrated circuit structure including transistors 20n, 20p enables the formation of both n-channel and p-channel high-k metal gate MOS transistors of optimized performance using a replacement gate process, while still facilitating the metal fill of both metal gate structures. More specifically, this structure is fabricated without requiring that the metal gate structure of one of the transistor channel conductivity types receive both metal gate layers. As a result, both n-channel and p-channel transistors can be formed at minimum feature size dimensions. Furthermore, according to embodiments of this invention, the composition and thicknesses of both the metal gate materials and also the high-k gate dielectric layers can be selected and optimized for transistors of both channel conductivity types, independently from the composition and thicknesses of those films selected for the other channel conductivity type transistor. Barrier metal layers suitable for the materials of each transistor construction can also be independently selected and optimized, without undue narrowing of the gap fill space in the replacement gate process.

Referring now to FIGS. 3a through 3l, a method of constructing the CMOS integrated circuit structure of FIG. 2b, including n-channel MOS transistor 20n and p-channel MOS transistor 20p, according to embodiments of this invention will now be described in detail. This description begins with the integrated circuit structure in the form shown in FIG. 3a, in which the structure includes features common to conventional polysilicon-gate CMOS integrated circuits. In this example, p-well 24p and n-well 24n are formed at the surface of a single-crystal silicon substrate. As such, the manufacturing process flow according to this embodiment of the invention is a twin-well process, in which wells 24 of both conductivity types are formed by conventional ion implantation processes. Alternatively, this CMOS structure may be fabricated according to a single-well process flow, in which case only either p-well 24p or n-well 24n is formed into a substrate of the opposite conductivity type, and in which MOS transistors of the appropriate channel conductivity type are formed at selected locations of that substrate. Further in the alternative, it is contemplated that this invention may be implemented in other types of semiconductor bodies, for example in a single-crystal semiconductor layer overlying an insulator layer according to the well-known silicon-on-insulator (SOI) technology. These and other implementation environments are contemplated to be within the scope of the claims in this case.

Figure 3A:
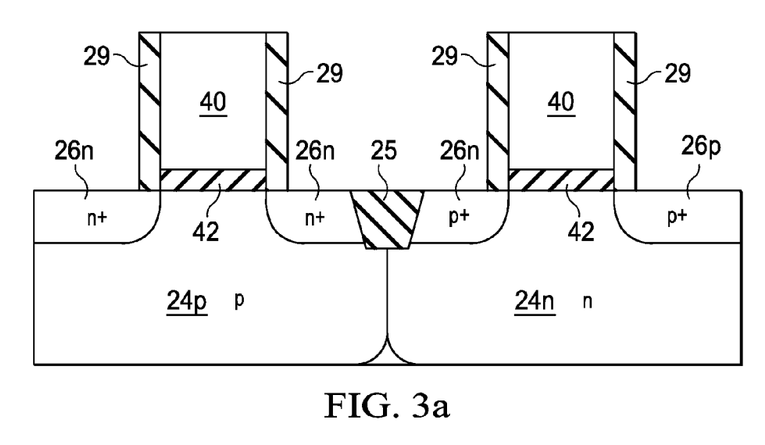
FIGS. 3a through 3l are cross-sectional views of the integrated circuit of FIGS. 2a and 2b at various stages of manufacture, according to embodiments of this invention.

Isolation dielectric structure 25 extends into the substrate from its surface, at a boundary between p-well 24p and n-well 24n. In this example, as described above relative to the structure of FIGS. 1a through 1h, isolation dielectric structure 25 is composed of silicon dioxide, deposited into an etched trench according to the well-known shallow trench isolation (STI) technology. Other instances of isolation dielectric structure 25 will of course be present, at those locations at which electrical isolation of surface elements is desired. As shown in FIG. 1a, gate dielectric layer 37 is disposed at locations of each of n-well 24p, 24n, with an instance of polysilicon gate structure 40 disposed over each. Gate dielectric 37 may be silicon dioxide or silicon nitride, or a combination of the two, or may consist of some other material given its function as essentially a placeholder. Gate dielectric layer 37 may extend over the full surface of the substrate, or may have been removed in the etch forming the gate structures as shown in the example of FIG. 3a. Polysilicon gate structures 40 overlie gate dielectric 37 at the locations at which the eventual metal transistor gate structures will be formed. Sidewall dielectric spacers 29 are disposed on the sides of gate structures 40. Dielectric spacers 29 may be formed of any suitable dielectric material, such as silicon dioxide or silicon nitride, and in the conventional manner by way of chemical vapor deposition and anisotropic etch. Spacers 29 serve to define the width and location of the gate structures in this replacement gate process, as will become apparent from this description.

At the stage of manufacture shown in FIG. 3a, the source and drain regions of transistors 20n, 20p are formed at the desired locations. N+ source/drain regions 26n are implanted doped regions formed into p-well 24p on opposing sides of gate structure 40 in the well-known self-aligned manner; similarly, p+ source/drain regions 26p are implanted doped regions formed into n-well 24n, self-aligned with gate structure 40 in that location. Spacers 29 themselves, or in combination with additional sidewall spacers, may be used to define lightly-doped-drain source/drain extensions of source/drain regions 26n, 26p, in the well-known manner.

The structure of FIG. 3a is fabricated according to conventional manufacturing processes for polysilicon gate CMOS integrated circuits, with the possible exception that spacers 29 may be added structures in those processes in which lightly-doped drain extensions are not formed, or are formed independently of those spacers 29. Gate structures 40 and gate dielectric 42 will be removed in the formation of high-k metal gate transistors 20n, 20p, and as such are "dummy" structures serving as a placeholder, and for placement and definition of source/drain regions 26n, 26p.

Figure 3B:
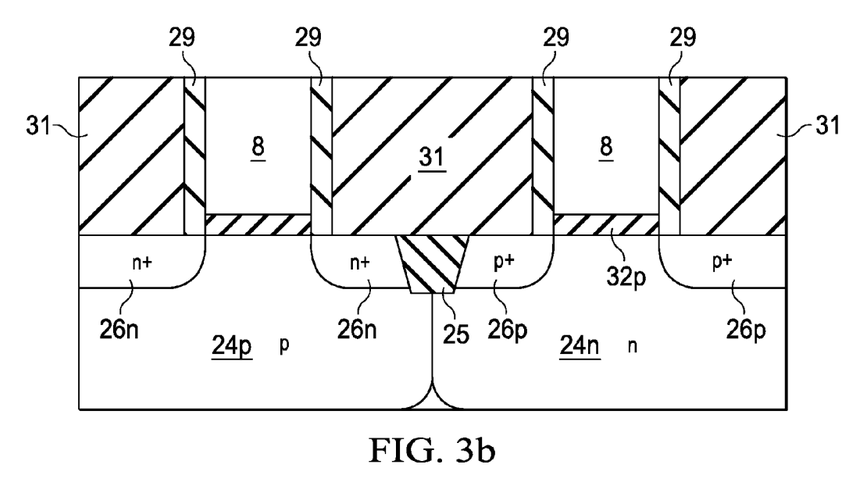
Figure 3C:
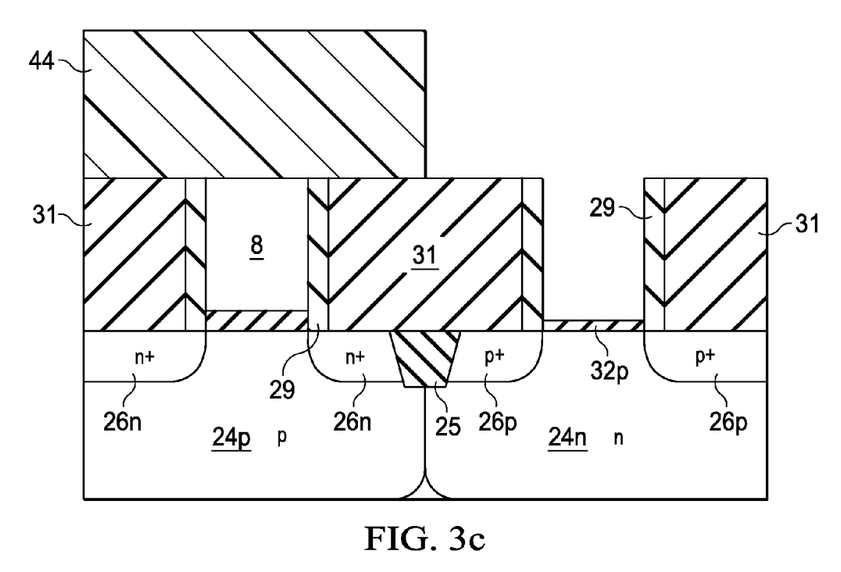

Following the construction of dummy gate structures 40 and sidewall dielectric spacers 29, gap fill dielectric material 31 is deposited over the structure by chemical vapor deposition (CVD); chemical-mechanical polishing (CMP) of gap fill dielectric 31 is then performed to planarize the structure, as shown in FIG. 3b. Gap fill dielectric 31 is composed of silicon dioxide, silicon nitride, or some other suitable dielectric material adequate to withstand subsequent processes, and to isolate the various conductive layers from one another. Following planarization of gap fill dielectric 31, photoresist 44 (FIG. 3c) is dispensed, patterned, and developed to protect dummy gate structure 40 in the locations at which n-channel transistor 20n will be formed (and, of course, the locations of other n-channel high-k metal gate transistors), exposing dummy gate structure 40 at the location of transistor 20p. A polysilicon etch is then performed to remove dummy gate structure 40 where exposed, followed by an etch of dummy gate dielectric 42 at the locations exposed by photoresist 44. The resulting structure is illustrated in FIG. 3c. Photoresist 44 may then be removed from the structure, in advance of the subsequent processes.

Figure 3D:
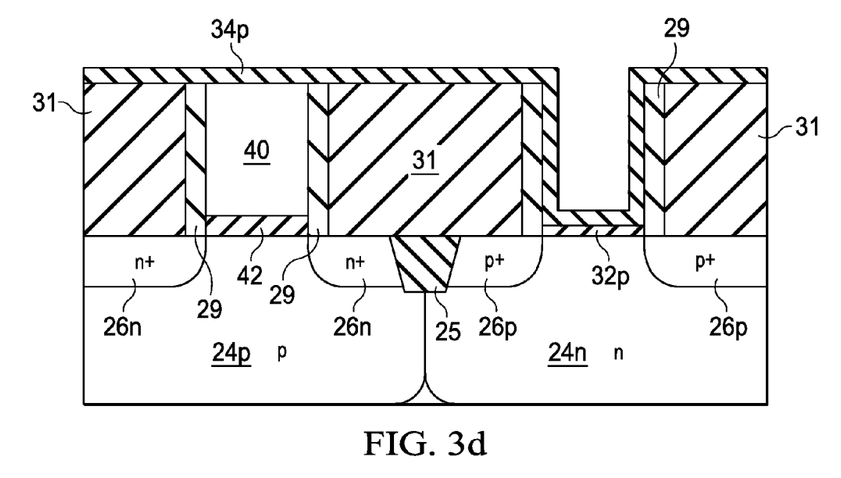

Upon clearing the surface of p-well 24n from which dummy gate structure 40 and dummy gate dielectric 42 were removed, the high-k gate material of transistor 20p can be formed, the result of which is shown in FIG. 3d. According to embodiments of this invention, interface layer 32p is first formed, either by thermal oxidation of silicon to form silicon dioxide, or by chemical vapor deposition of silicon dioxide, silicon nitride, or another suitable dielectric material. The example of FIG. 3d illustrates interface layer 32p as thermal silicon dioxide, and as such interface layer 32p does not form on the sides of spacers 29; alternatively, a deposited material would form on the sides of spacers 29 as well as the top surface of gap fill dielectric 31 and other structures. Following the formation of interface layer 32p, high-k gate dielectric 34p is deposited overall. The particular material of high-k gate dielectric 34p may be hafnium oxide, or one of the other materials specified above in connection with FIG. 2b.

Also as discussed relative to FIG. 2b, the composition and thicknesses of interface layer 32p and high-k gate dielectric 34p can be selected to optimize the performance, reliability, and other characteristics of p-channel transistor 20p, independently from n-channel transistor 20n. For example, interface layer 32p of thermal silicon dioxide can be relatively thin, while high-k gate dielectric 34p can be made relatively thick.

Figure 3E:
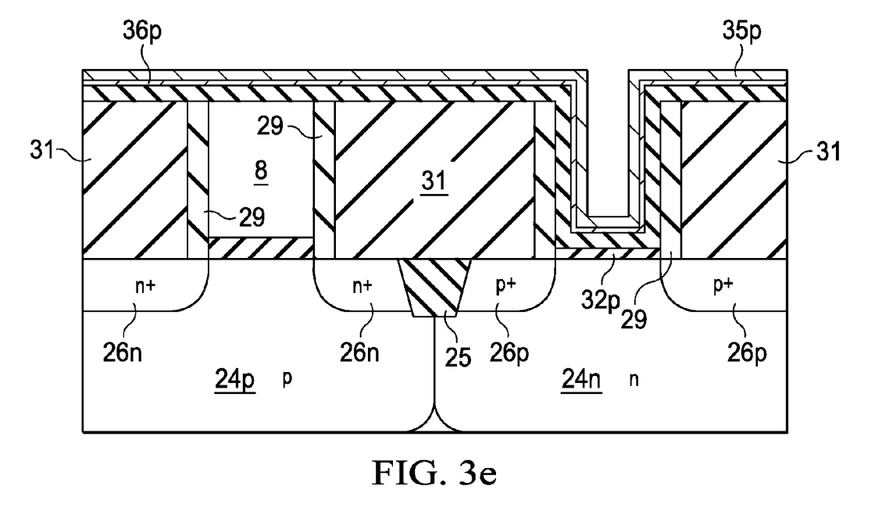

Following the formation of high-k gate dielectric 34p, barrier metal 36p and metal gate layer 35p can then be formed by sputtering or another appropriate method, resulting in the structure shown in FIG. 3e. As discussed above relative to FIG. 2b, the composition and thicknesses of barrier metal 36p and metal gate layer 35p are selected to have the desired work function for p-channel transistor 20p, along with a suitable barrier to interdiffusion between high-k gate layer 34p and metal gate layer 35p.

Figure 3F:
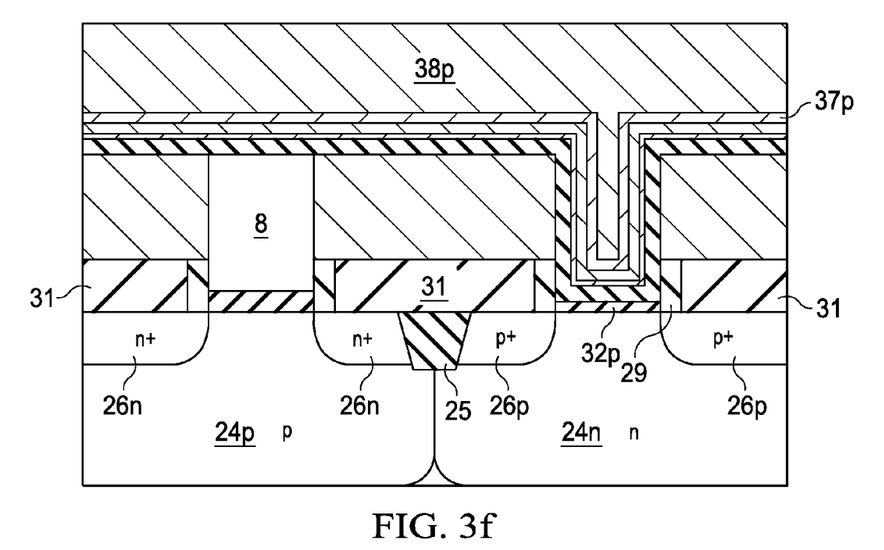
Figure 3G:
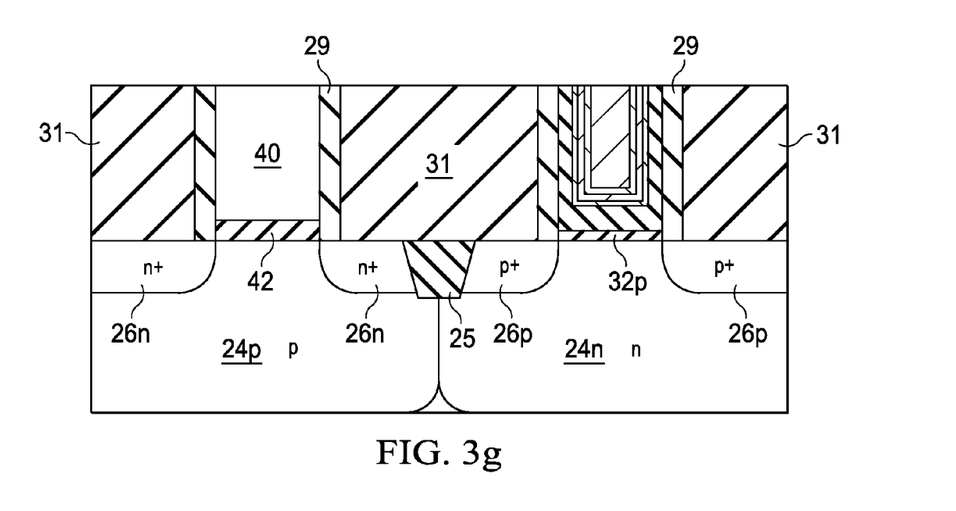

Referring now to FIG. 3f, barrier metal 37p and fill metal 38p are next formed overall, typically by way of sputter deposition. As discussed above, barrier metal 37p limits interdiffusion between fill metal 38p and underlying layers, and as such typically is a relatively thin layer. Fill metal 38p is intended to fill the remaining gap within the gate structure for transistor 20p, and as such is typically overfilled by a substantial margin, as shown in FIG. 3f. However, it is contemplated that the gap within metal gate structure 30p into which fill metal 38p is sputtered will be sufficiently wide, with only the single level of metal gate layer 35p therein, to minimize step coverage difficulties and voiding. Following the deposition of fill metal 38p, CMP is performed to planarize the structure to a level sufficient to expose dummy polysilicon gate 40 at the location of eventual transistor 20n, as shown in FIG. 3g. This CMP process may thin fill dielectric 31 and metal gate structure 30p of transistor 20p to some slight extent, but any such thinning is contemplated to be minimal using conventional control mechanisms.

Figure 3H:
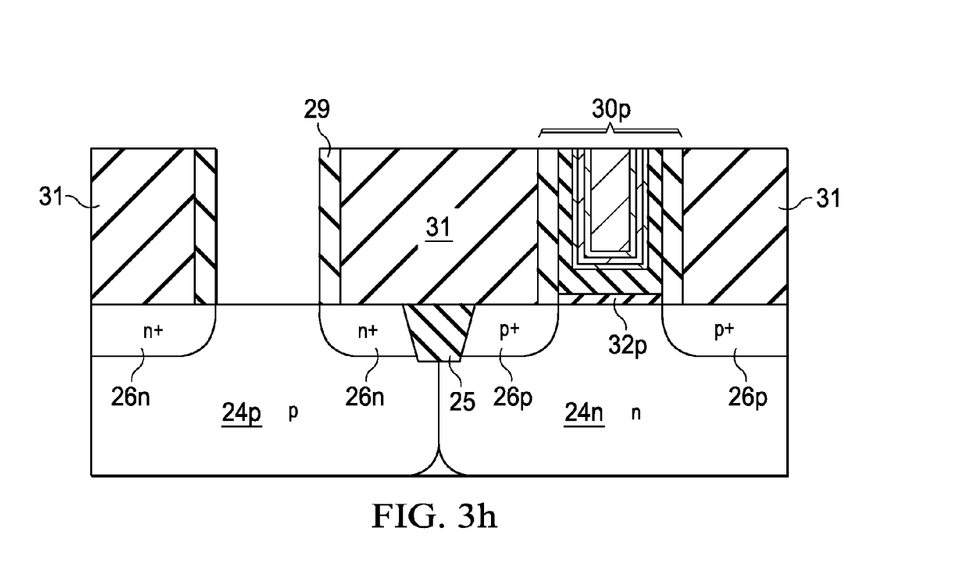
Figure 3I:
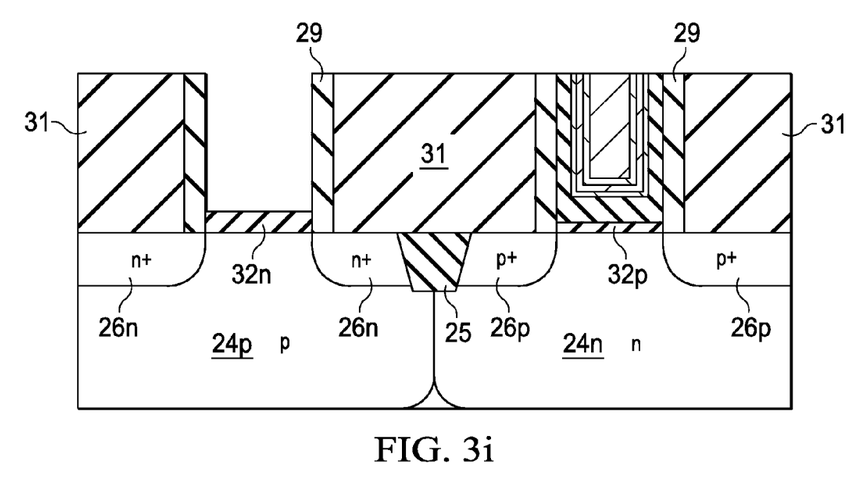
Figure 3J:
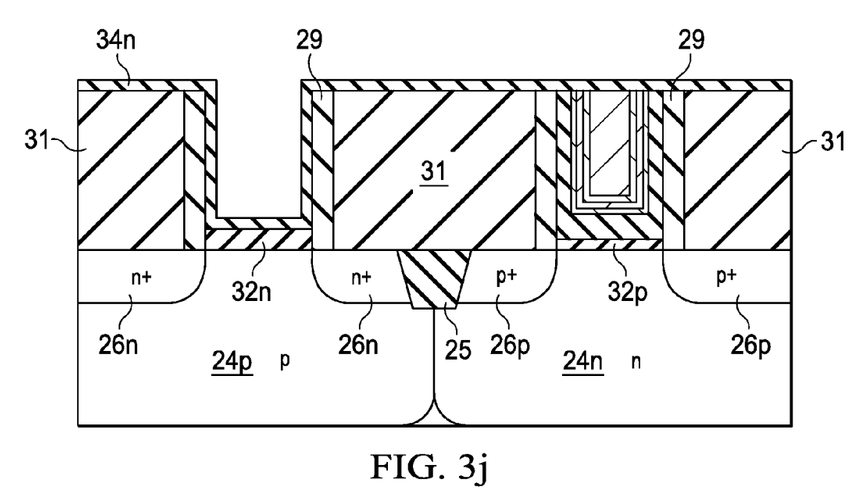

Following the CMP of fill metal 38p, dummy gate structure 40 and dummy gate dielectric 42 are removed from the location of transistor 20n, by way of respective etch processes, resulting in the structure shown in FIG. 3h. Once the surface of p-well 24p between spacers 29 is clear, interface layer 32n is formed by thermal oxidation of the silicon at that surface, or by deposition of the desired dielectric material, resulting in the structure of FIG. 3i. Because it is separately formed, interface layer 32n need not be same material or thickness as interface layer 32p. Rather, the composition and thickness of interface layer 32n can be independently selected to optimize the performance and reliability of transistor 20n. In the example of FIG. 3i, interface layer 32n is a thermal oxide, formed to a greater thickness than that of interface layer 32p. High-k gate dielectric 34n is then deposited overall, as shown in FIG. 3j. As discussed above, high-k gate dielectric 34n may have a different composition and thickness from that of high-k gate dielectric 34p, with those properties selected to optimize the performance and reliability of transistor 20n independently from that of transistor 20p. In any case, high-k gate dielectric 34n consists of a high dielectric constant insulating material, such as hafnium oxide. In the example shown in FIG. 3j, high-k gate dielectric 34p is thinner than high-k gate dielectric 34n.

Figure 3K:
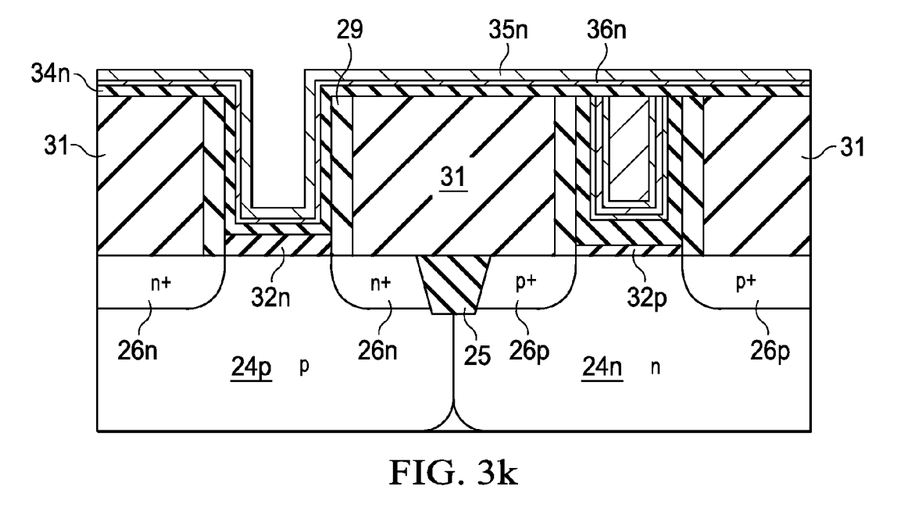

As shown in FIG. 3k, barrier metal 36n and metal gate layer 35n are then formed by sputtering or another appropriate method over high-k gate dielectric 34n. The composition and thickness of metal gate layer 35n are selected to have the desired work function for n-channel transistor 20p, and as such will typically be a different material or at least have a different doping from that of metal gate layer 35p. The composition and thickness of barrier metal 36n are selected to provide a barrier to interdiffusion between high-k gate layer 34n and metal gate layer 35n, and may be different from that of barrier metal 36p, particularly if metal gate layer 35n is of a different composition than metal gate layer 35p.

Figure 3L:
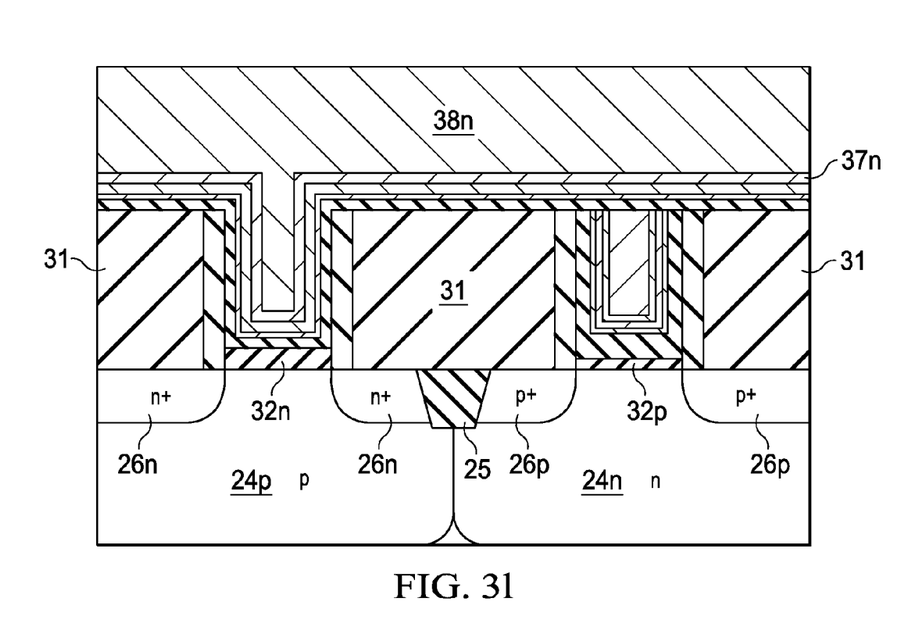

Barrier metal 37n and fill metal 38n are then formed overall, again by way of sputter deposition. The resulting structure is illustrated in FIG. 3l. The composition of barrier metal 37p is selected to prevent interdiffusion between fill metal 38n and underlying layers, and will be typically relatively thin. Fill metal 38n will typically be of the same material as fill metal 38p, but may alternatively be of a different metal or metal compound if desired. The sputtering of fill metal 38n overfills the gap within the gate structure of transistor 20n, as suggested by FIG. 3l. As in the case of transistor 20p discussed above, this gap within metal gate structure 30n is relatively wide, especially as compared with that of conventional processes in which the second replacement metal gate structure to be formed includes both metal gate layers. With such a wide gap, fill metal 38n can be sputtered with good step coverage at the corners, and without significant risk of voiding within the interior of gate structure 30n. Following the deposition of fill metal 38n, CMP is performed to planarize the structure, thus completing the construction of transistors 20n, 20p, and resulting in the structure shown in FIG. 2b, and described above.

According to embodiments of this invention, a CMOS integrated circuit structure incorporating high-k metal gate MOS transistors, and a process of fabricating the same according to a replacement gate approach, are provided that avoids vulnerabilities caused by the deposition of fill metal into a narrowed gap in the interior of a metal gate structure that includes multiple metal gate layers. This structure and method thus produces a CMOS integrated circuit of improved performance and reliability, and also enables construction of transistors of both conductivity types to the smallest dimensions available for a given technology node. In addition, by avoiding the inclusion of both metal gate layers within the same gate structure, sufficient room remains to include barrier metal layers where appropriate, further enhancing the reliability of the structure. Embodiments of this invention also enable the selection of the composition and thicknesses of metal gate materials and high-k gate dielectric layers for transistors of both channel conductivity types, allowing independent optimization of the performance and reliability of all transistors in the CMOS structure without requiring trade-offs between the transistor types.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit structure formed at a semiconducting surface of a body, comprising:
   filler dielectric structures disposed at the surface;
   a first transistor, of a first channel conductivity type, comprising:

a first pair of source/drain regions of a first conductivity type formed into a region of the surface of a second conductivity type, the second conductivity type opposite to the first conductivity type, the source/drain regions of the first pair spaced apart from one another to define a first channel region at the surface therebetween;

a first interface dielectric layer overlying at least a portion of the surface of the first channel region within a first gap between filler dielectric structures;

a first high-k dielectric material overlying the first interface dielectric layer within the first gap;

a first metal gate material, comprised of a metal or metal compound and disposed over the first high-k dielectric material within the first gap; and a first fill metal disposed over the first metal gate material within and substantially filling the interior of the first gap;

a second transistor, of the second channel conductivity type, comprising:

a second pair of source/drain regions of the second conductivity type formed into a region of the surface of the first conductivity type, the source/drain regions of the second pair spaced apart from one another to define a second channel region at the surface therebetween;

a second interface dielectric layer overlying at least a portion of the surface of the second channel region within a second gap between filler dielectric structures;

a second high-k dielectric material overlying the second interface dielectric layer within the second gap;

a second metal gate material, comprised of a metal or metal compound and disposed over the second high-k dielectric material within the second gap; and a second fill metal disposed over the second metal gate material within and substantially filling the interior of the second gap;

wherein the first and second high-k dielectric material differ from one another in an attribute selected from the group consisting of thickness and composition; and wherein the first metal gate material and the second metal gate material differ from one another in composition with the first transistor being free of the second metal gate material and the second transistor being free of the first metal gate material.

2. The structure of claim 1, wherein the first and second interface dielectric layers differ from one another in an attribute selected from the group consisting of thickness and composition.

3. The structure of claim 1, further comprising:
a first barrier layer disposed between the first high-k material and the first metal gate material within the first gap; and
a second barrier layer disposed between the second high-k material and the second metal gate material within the second gap.

4. The structure of claim 1, further comprising:
dielectric spacers disposed on sidewalls of the first and second gaps.

5. The structure of claim 4, wherein the first high-k dielectric material also extends along the sides of the first gap between the dielectric spacers.

6. The structure of claim 5, wherein the first interface dielectric layer also extends along the sides of the first gap between the first high-k dielectric material and the dielectric spacers.

7. The structure of claim 5, wherein the first metal gate layer also extends along the sides of the first gap within portions of the first high-k dielectric material.

8. The structure of claim 1, wherein the first channel conductivity type is n-channel;
wherein the second channel conductivity type is p-channel;
wherein the first interface dielectric layer is thicker than the second interface dielectric layer;
and wherein the first high-k dielectric layer is thinner than the second high-k dielectric layer.

* * * * *